(12) United States Patent
Oborny

(10) Patent No.: US 6,943,573 B1
(45) Date of Patent: Sep. 13, 2005

(54) SYSTEM AND METHOD FOR SITE-TO-SITE YIELD COMPARISON WHILE TESTING INTEGRATED CIRCUIT DIES

(75) Inventor: James L. Oborny, Sachse, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/806,623

(22) Filed: Mar. 23, 2004

(51) Int. Cl.[7] .............................................. G01R 31/06
(52) U.S. Cl. ....................................... 324/754; 324/765
(58) Field of Search ................................. 324/754, 761, 324/762, 755, 765; 439/482, 824; 438/14–18

(56) References Cited

U.S. PATENT DOCUMENTS

| | | | |
|---|---|---|---|
| 5,623,214 A | * | 4/1997 | Pasiecznik, Jr. ............ 324/754 |
| 5,758,537 A | | 6/1998 | Throssel |
| 5,818,249 A | * | 10/1998 | Momohara .................. 324/762 |
| 6,210,983 B1 | | 4/2001 | Atchison et al. |
| 6,764,866 B1 | * | 7/2004 | Lin et al. ...................... 438/11 |

* cited by examiner

Primary Examiner—Vinh P. Nguyen
(74) Attorney, Agent, or Firm—Yingsheng Tung; Wade James Brady, III; Frederick J. Telecky, Jr.

(57) ABSTRACT

Disclosed herein are systems and methods for testing the functionality of a plurality of integrated circuit dies formed in a plurality of rows on a semiconductor wafer. In one embodiment, the system includes a probe device having at least two probing areas configured to test the functionality of the plurality of dies. The first probing area of the at least two probing areas is positioned to test each of a plurality of dies in a first row of the plurality of rows and a second probing area of the at least two probing areas is positioned to test each of a plurality of dies in a second row of the plurality of rows simultaneously with the first probing area. The system also includes a tester device coupled to the probe device and configured to compare test data received from the die in the first row with test data received from the die in the second row.

22 Claims, 3 Drawing Sheets

SYSTEM AND METHOD FOR SITE-TO-SITE YIELD COMPARISON WHILE TESTING INTEGRATED CIRCUIT DIES

TECHNICAL FIELD

Disclosed embodiments herein relate generally to testing the functionality of integrated circuit dies on semiconductor wafers, and more particularly to systems and methods for site-to-site yield comparison while testing of such dies for having greater manufacturing control and less test related yield loss.

BACKGROUND

Fabrication of semiconductor integrated circuits (ICs) is an extremely complex process that involves many precise manufacturing and testing operations. Such ICs are fabricated by selectively implanting impurities into, and applying conductive and insulating layers onto, a semiconductor substrate, often called a "wafer." Semiconductor ICs (or "chips") are not manufactured individually, but rather as an assembly of typically thousands of IC dies on a wafer, which is then diced to produce the individual IC chips.

Increasing wafer production yield of such dies is an ongoing problem in the manufacture of semiconductor chips. Due to various defects that can occur in the fabrication of a wafer, a significant number of dies are discarded for non-functionality reasons, thereby decreasing the percentage yield per wafer and driving up the cost of the individual chips. Defects are typically caused by foreign particles, minute scratches, and other imperfections introduced during photoresist, photomask, diffusing, or other manufacturing operations. Such wafer yield impacts the number of wafer starts at the inception of production needed to meet specific customer order quantities for finished chips at the end of the production line. With the high demand for semiconductor chips and more orders than can be filled by some production facilities, predicting yield to accurately gauge wafer starts, as well as utilizing defect information to remove yield-detracting operations, are important aspects of improving the efficiency, and hence the output, of the fabrication facility.

In an effort to increase wafer yield, completed IC chips on semiconductor wafers are subjected to a variety of tests to determine which devices function properly so that processing steps can be modified and inoperative devices can be removed from further processing. The testing of a die on a completed wafer, or "multi-probe" testing, is generally performed by coupling logic test signals to the inputs of the dies (via contact pads) and sensing the output signals to determine that the device functions properly. This is referred to as "static" or "DC" testing since low frequency logic input signals are used and the outputs are sensed after the device reaches a steady-state condition. While the static test is important in predicting whether a device will be operable following assembly and packaging, it typically does not insure that a completed device will pass a final test that simulates operation at normal operating frequencies and switching speeds. Thus, "dynamic" or "AC" tests are performed to more accurately predict which die will pass a similar final test after completion. Dynamic testing includes the application of high-speed logic signals to the die while sensing the outputs to measure operating parameters, such as propagation delay times and switching speeds under predetermined load conditions.

Conventional wafer testing techniques typically position a multi-pin probe array in contact with the conductive bond pads on an IC chip. Information from these tests is compared with limits pre-programmed into the test equipment of the test program. The dies are either rejected or accepted based on this comparison. Moreover, this test is typically performed on all the dies on the wafer, often testing dies in one row on the wafer, while simultaneously testing dies in another row, when "multi-site" testing techniques are employed. If a dies fails, the testing program usually instructs a mapping system to mark the particular dies as bad so that it is later discarded when the wafer undergoes singulation (i.e., dicing of the individual dies from one another). Unfortunately, if the testing procedure employed is flawed, otherwise functional chips are erroneously marked as bad and discarded, increasing manufacturing costs. Conversely, if problems are present in the testing procedure, non-functioning or malfunctioning dies may be passed through the process as good dies, typically resulting in inoperative end products. Historically, "correlation wafers" are used to compare the results of the current testing setup, with results from previously tested units.

BRIEF SUMMARY

Disclosed herein are systems and methods for testing the functionality of a plurality of integrated circuit dies formed in a plurality of rows on a semiconductor wafer. In one embodiment, the system includes a probe device having at least two probing areas configured to test the functionality of the plurality of dies. The first probing area of the at least two probing areas is positioned to test each of a plurality of dies in a first row of the plurality of rows and a second probing area of the at least two probing areas is positioned to test each of a plurality of dies in a second row of the plurality of rows simultaneously with the first probing area. The system also includes a tester device coupled to the probe device and configured to compare test data received from the die in the first row with test data received from the die in the second row.

In another aspect, a method for testing includes testing the functionality of each of a plurality of dies in a first row of the plurality of rows with a first probing area. The method also includes testing the functionality of each of a plurality of dies in a second row of the plurality of rows with a second probing area simultaneously with the testing of dies in the first row. In such an embodiment, the method further includes comparing test data regarding the testing of dies in the first row with test data regarding testing of dies in the second row.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

Figure 1:
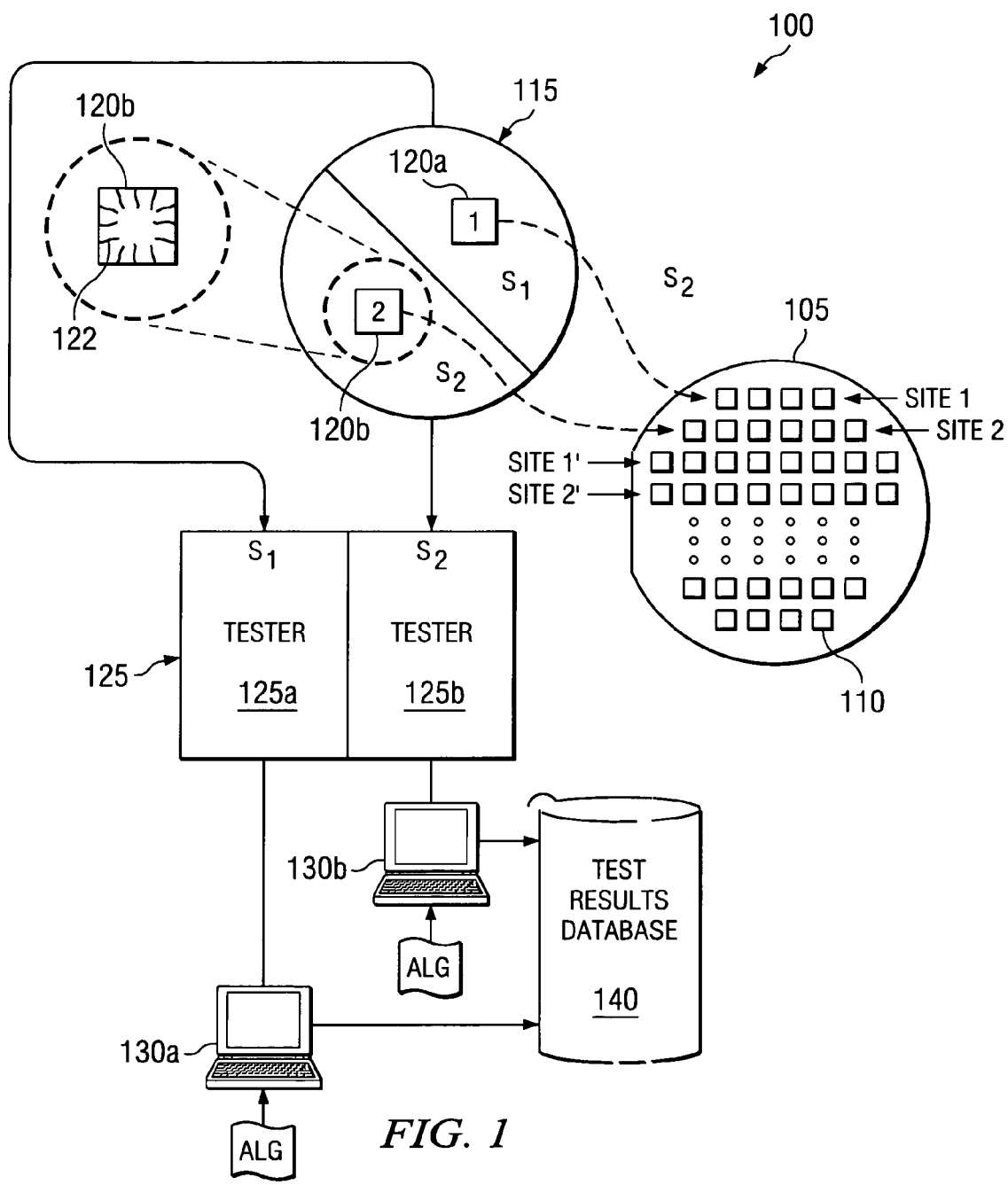
FIG. 1 illustrates one embodiment of a system for testing the functionality of a plurality of integrated circuit dies constructed in accordance with the disclosed principles.

Referring initially to FIG. 1, illustrated is one embodiment of a system 100 for testing the functionality of a plurality of integrated circuit (IC) dies constructed according to the principles disclosed herein. In the illustrated embodiment, the IC dies (one of which is labeled 110) are formed on a semiconductor wafer 105 in multiple rows (labeled "Site 1" and "Site 2"). As shown, the wafer 105 typically includes many sets of first and second rows of dies 110, and in some embodiments, each of the first rows are adjacent to corresponding ones of the second rows (i.e., rows of Site 1 are adjacent to rows of Site 2). The benefits of such an arrangement are discussed in greater detail below.

In accordance with conventional practice, the semiconductor wafer 105 may undergo testing to determine wafer yield, which refers to the number of functional versus nonfunctional dies 110 produced from the wafer 105. As is well known, the functionality of such dies 110 may be affected by any of a number of different reasons, which are outside the scope of this disclosure. To conduct the testing disclosed herein, the system 100' provides a probe device 115. In the illustrated embodiment, the probe device 115 is a probe card 115, although the disclosed system 100 is not limited to any particular type of probing device. Within the probe card 115 are first and second probing areas 120a, 120b. Although only two probing areas 120a, 120b are illustrated, the probe card 115, when employed with the present system 100, may include any number of probing areas. As shown in the detailed view of the second probing area 120b, any such probing area may include conductive contacts (one of which is labeled 122) that are configured to electrically contact electrical contact pads on the dies 110. In more specific embodiments, the conductive contacts 122 may be probe needle extending from the probing areas, perhaps of the type conventionally available.

The first and second probing areas 120a, 120b are provided to test the functionality of each of the dies 110 formed in the first and second rows (Site 1, Site 2), respectively. Moreover, the first and second probing areas 120a, 120b are configured to test their respective dies 110 (in corresponding rows) substantially simultaneously. Specifically, the probe card 115 may be incrementally passed over the wafer 105 so that the first and second probing areas 120a, 120b pass over and test each of the dies 110 in their respective rows. For example, the first and second probing areas 120a, 120b may start with the first dies at the far left of both the first and second rows, and then proceed from left to right until all of the dies in the initial set of first and second rows have been tested. Then the probe card 115 may be moved down to the next set of first and second rows (Site 1', Site 2'). The first and second probing areas 120a, 120b may then be moved from right to left as each of the dies 110 on the second set of first and second rows are tested. As shown, the orientation of the first and second probing areas 120a, 120b with respect to each other may be on a diagonal so as to test dies 110 from the rows of Site 1 and Site 2 that are not vertically adjacent to one another, however this type of arrangement is not required. This technique of testing multiple dies on corresponding rows is typically known as "multi-site testing" of semiconductor wafers 105.

However, the present system 100 differs from conventional systems in that it also includes a tester device 125 that is coupled to the probe card 115. The tester device 125 is configured to compare test data received from the testing of dies 110 in Site 1 with test data received from testing the dies 110 in Site 2. As the probe card 115 continues to move through each set of first and second rows on the wafer 105, test data from each of the rows in Site 1 and Site 2 are compared to each other. In embodiments having only Site 1, Site 2, the testing device 125 includes first and second computing portions 125a, 125b corresponding to the first and second probing areas 120a, 120b. The first and second computing portions 125a, 125b are configured to individually and separately process the testing of the dies 110 on all the first rows (all of Site 1) and all the second rows (all of Site 2), respectively. Of course, in embodiments where the probe card 115 includes more than two probing areas, the testing device 125 may include a corresponding number of computing portions for individually processing the test results received from those multiple probing areas.

With conventional multi-site testing, the testing process is simply using less time to test a wafer by testing multiple sites simultaneously. But each site and each of the dies with those sites are still tested against a correlation wafer or other device having similar information. In the disclosed site-to-site testing technique, however, the yields between two or more different sites (e.g., rows) are compared to determine whether the testing procedure and tools employed to test the dies are functioning properly. As mentioned above, malfunctioning testing procedures and tools can lead to the mismarking of dies as good or bad when the opposite is true. Similarly, manufacturing processes of the dies may be erroneously blamed for a problem caused by a certain probe card or other testing equipment.

To perform the comparison, the testing device 125, which is typically composed of computer hardware running specialized software programs, employs a tolerance algorithm to analyze the comparison of test data from site-to-site. In short, the algorithm determines a difference in the percentage yield for different sites on the wafer 105 (e.g., the yield for all the rows marked Site 1 versus Site 2 in FIG. 1), and then determines whether the discovered variation in yield between the sites is less than a predetermined tolerance percentage. As an example, assume the wafer 105 includes 2000 dies distinguished into the illustrated Site 1 and Site 2, 1000 dies on Site 1 and 1000 on Site 2. Next, a testing procedure is employed that determines that the overall wafer 105 has an 80% yield, meaning 1600 good dies have been identified. If Site 1 has 790 good dies and Site 2 has 810 good dies, that would be a 79% yield and 81% yield per site, respectively. Then, a tolerance threshold for an acceptable variance in the comparison of the results of the sites is calculated using equation (1):

$$15\% - \left(\frac{\#GEC(\text{high\_site})}{100}\right) \quad (1)$$

where #GEC(high_site) means the site on the wafer having the larger number of Good Effective Chips (i.e., functional dies), and 15% is selected based on historical data taken off of previous samples. Thus, since Site 2 had 810 goods dies, as compared to 790 for Site 1, equation (1) may be solved:

$$15\% - \left(\frac{810}{100}\right) = 15\% - 8.1 = 6.9\%.$$

As a result, if the variation in percentage yield between the two sites exceeds 6.9%, then the testing process is halted so a solution to the problem may be found and corrected. Thus, equation (2) provides the variation between the two sites:

$$\% \text{ GEC(high\_site)} - \% \text{ GEC(low\_site)} \qquad (2)$$

where #GEC(high_site) is defined as before, and #GEC (low_site) means the site on the wafer having the lower number of functional dies. Thus, since both yields are known, equation (2) may be solved:

$$81\% - 79\% = 2\%.$$

Therefore, since a 2% variation between sites does not exceed 6.9%, the testing process is found to be acceptable. If the percentage variation exceeded the predetermined threshold tolerance, then the testing device 125 would typically be configured to signal that a problem is likely present in the testing process so that the process is halted for inspection.

The comparison between site yields provided by an algorithm employing the equations above is based on the premise that since very similar manufacturing techniques are used to produce all the sites on the wafer 105, problems associated with those processes should tend to be equally distributed across the wafer 105. Thus, if yield for all the rows in Site 1 is significantly lower than the yield for all the rows in Site 2, then a problem with the testing of the dies in Site 2 is more likely to be the problem, as opposed to a problem in the manufacturing processes of the wafer affecting the dies in Site 2 more so than those in Site 1. For example, the probe needles 122 associated with the second probing area 120b of the probe card 115 may be bent, and therefore not making proper electrical contact with the contact pads of many of the dies in Site 2. On some occasions, a number of similarly positioned dies in both sites will be erroneously marked as bad dies. In this situation, although a comparison of these test results alone may not immediately reveal a problem, the testing device 125 may still be configured to send an alert based on the simple fact that a number of dies in both sites, and in the same positions, are being found bad.

Also illustrated in FIG. 1 are first and second control terminals 130a, 130b coupled to the corresponding first and second computing portions 125a, 125b of the testing device 125. The first and second control terminals 130a, 130b may typically be employed by administrators of the disclosed system/process to control the operation of the testing device 125, as well as the operation of the probe card 115. In addition, in some embodiments, the first and second control terminals 130a, 130b are employed to control and even modify the algorithm and calculations discussed above. In specific embodiments, the algorithm is embodied as software running within the hardware of the testing device 125, and the first and second control terminals 130a, 130b may be used to load such software program code into the testing device 125.

Among the advantages of the disclosed technique is the elimination of the use of correlation wafers. More specifically, since this process is conducted in real-time, on real production volume, the extra steps of validating a correlation wafer and then comparing the testing results for each site to that correlation wafer are now unnecessary. Instead, with the present technique only the functionality of the individual dies needs to be checked, and the results of such testing compared on a site-to-site basis. In addition, since the comparison and tolerance algorithm is based on the yield of the materials and the processes used to manufacture a specific type of wafer, as the yield of that type of wafer improves, the acceptable tolerance may be dynamically tightened for that specific wafer type, thus assisting in producing better overall results.

Another advantage, as mentioned above, is the ability to stop the testing process in real-time once a problem is detected in the manner described above. Additionally, when a problem is detected, the real-time stoppage of the line typically results in the immediate attention of an authorized person in order to allow the overall process to continue. This capability also eliminates the chance that bad dies are marked good, or that good dies are marked bad and later discarded. In typical testing procedures, an otherwise good die is marked as a bad and later discarded in almost every situation. As a result, immediate attention to the stoppage would typically result in preventing this result, and thus in increasing overall wafer yield. Such a result would typically lower overall manufacturing expense by preventing the mismarking of numerous wafers that must later be retested, at significant expense, once a problem is detected.

The illustrated system 100 still further includes a database 140 that is coupled to the testing device 125 in advantageous embodiments, the test results from all of the dies 110 on the wafer 105 are transferred from the testing device 125 and stored in the database 140. This information can be stored in the database 140 and retrieved later to analyze problems with the testing procedures/equipment and thus determine what is causing any unusual results. In more specific embodiments, the control terminals 130a, 130b may be employed to transfer and store the testing results. Advantageously, the database 140 may be a conventionally available database, such as those employed in typical computer systems and networks, however the disclosed system 100 is not so limited. Also, the database 140 may be accessible locally or off-site, via a network, as desired.

With this storage of testing data on both a wafer-by-wafer basis and a die-by-die basis, a great advantage is provided in that almost endless post-analysis work on passes and fails may be done to continuously improve on the testing, and even manufacturing, process. For example, the recorded testing data may reveal that all the third dies from the left on all the rows of Site 1 are bad. Moreover, such post-analysis may be done to determine various patterns associated with the actual products. For instance, post-analysis may be done to determine which wafers are having more (or less) problems than others, which testing equipment is more often the cause of detected problems, which fabrication facility typically provides better (or worse) product than other facilities, and even which areas or employees of a specific fabrication facility or process are more (or less) often the cause of a problem. Furthermore, in embodiments where the algorithm is embodied in software, the disclosed technique may be more easily installed and adaptable to most, if not all, of the fabrication and testing facilities available. As such, if an existing testing system/procedure employs a pass/fail approach to dies testing, then the disclosed system and process is likely adaptable to that existing technique with little trouble.

Figure 2:
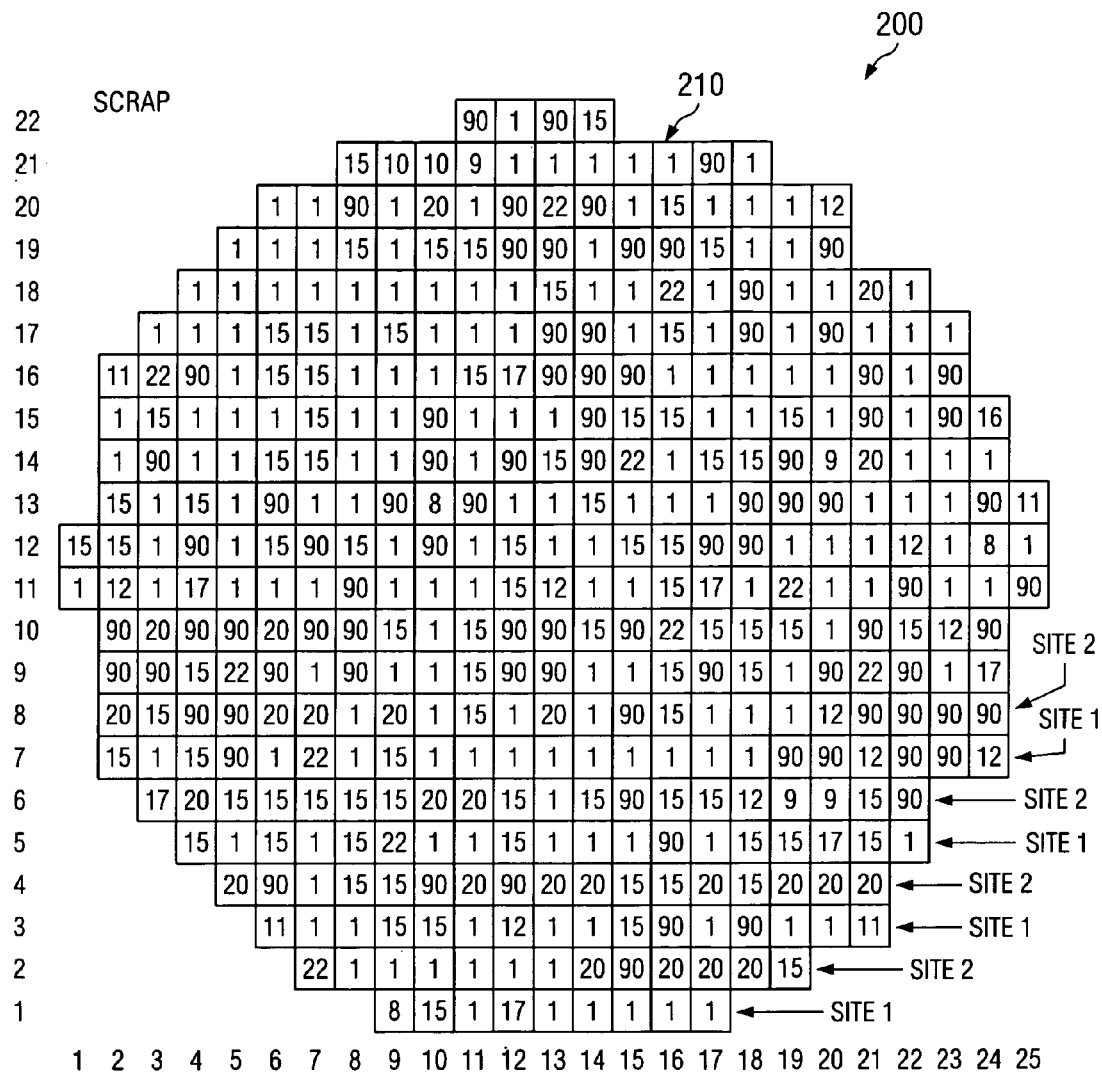
FIG. 2 illustrates one embodiment of testing results for an exemplary wafer.

Turning now to FIG. 2, illustrated is one embodiment of a display 200 of testing results on an exemplary wafer 210. In this illustration, nonfunctional (or bad/fail) dies are shown in black. As shown, the number of bad dies appearing in rows associated with Site 2 far outweigh the number of bad dies appearing in rows associated with Site 1. For example, in the bottom-most set of sites, six bad dies are marked in Site 2, while only one is marked in Site 1. Moving up a set of sites, five bad dies are marked for Site 1 compared to 13 for Site 2. Moving up to next set, 8 bad dies are marked in Site 1 compared to 13 in Site 2. Faced with such results, in this example, the testing procedure should be stopped to determine why the yield from Site 2 is significantly less than that of Site 1. For example, the problem may simply be that the contacts of the probe areas are failing to make contact with the contact pads on many of the dies; however, further investigation may reveal more serious problems, the early detection of which saved substantial cost.

Figure 3:
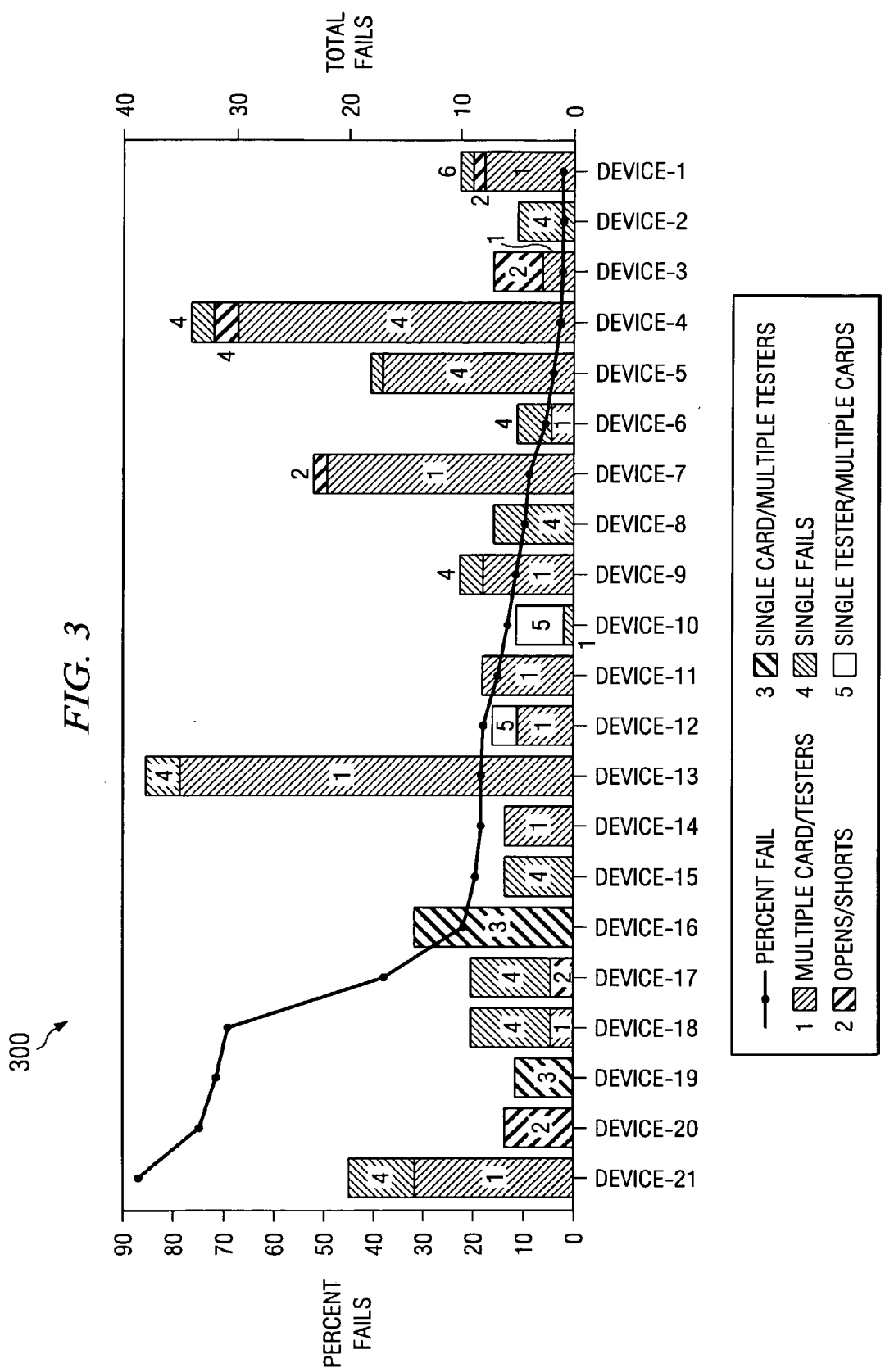
FIG. 3 illustrates a compound histogram displaying a visual representation of post-analysis data determined as described herein.

Turning finally to FIG. 3, illustrated is a compound histogram 300 displaying a visual representation of post-analysis data provided as discussed above. The various types of products (e.g., wafers) tested are listed horizontally, while the number of fails is listed vertically on the right side of the histogram 300. Also, the percentage of fails is listed on the left side of the histogram 300 and illustrated using the line graph crossing the histogram 300. Additionally, post-analysis results are obtained using the variety of different sample products under various conditions, such as multiple probe cards employed with multiple testing devices, a single probe card used with multiple testing devices, and a single testing device employing multiple probe cards. These variation are indicated in the shading key.

In one example, the left most product of the histogram 300 is illustrating that about 90% of the wafers tested, when tested with a single testing device using various probe cards, failed the comparison disclosed herein. Moreover, in order to further narrow the problem, post-analysis is made for a number of other products. Thus, based on the collective results, it may then be determined whether it is the fabrication of the specific type of wafer that holds the problem, or if similar results occurred with other products or testing equipment. For instance, if the same results are obtained on different products when the different probe cards are used on the same testing device, the testing device itself may be the culprit. However, if the various testing scenarios are conducted on other products without the same results, the problem may actually be with the fabrication process for the specific wafer type initially tested.

Moreover, the histogram 300 may be configured to visually illustrate the type of failure (e.g., short circuit, open circuit, logic failure, etc.) as well, each of which typically cause a dies to fail in a particular manner. This information may also be employed along with the other information to conduct detailed post-analysis on many different aspects of the manufacturing and testing processes and equipment. Also, "single fails" are also graphed in FIG. 3, which refer to when all the failing occurrences happened in a specified time period on the same equipment and probe card. With limited fail occurrences, it can be determined to be an equipment or probe card issue, or simply, that the sample size is not high enough to draw a conclusion. In viewing all of the results displayed across the histogram 300, a substantial number of different testing scenarios may be reviewed to help determine the cause of problems detected during testing, which in turn helps to significantly decrease overall manufacturing costs by increasing individual wafer yield.

However, in viewing all of these results, it should be remembered that the heights of the bars do not indicate the percent of the fails (magnitude of problem), but rather simply a volume for each product. By employing such a distinction, problems areas of low percentage fail rates of product but high number of fail occurrences may be identified and attended to before, for example, areas of high percentage fail rates having low or even moderate number of fail occurrences, due to the higher percentage of overall product affected. In short, post-analysis may be employed to address problems based on the percentage of certain products affected, rather than being based on simply the number of problems detected, and vice-versa.

While various embodiments of systems and methods for testing the functionality of a plurality of integrated circuit dies on a site-to-site basis have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A system for testing the functionality of a plurality of integrated circuit dies formed in a plurality of rows on a semiconductor wafer, the system comprising:

a probe device having at least two probing areas configured to test the functionality of the plurality of dies, a first probing area of the at least two probing areas positioned to test each of a plurality of dies in a first row of the plurality of rows and a second probing area of the at least two probing areas positioned to test each of a plurality of dies in a second row of the plurality of rows simultaneously with the first probing area; and a tester device coupled to the probe device and configured to compare test data received from the dies in the first row with test data received from the dies in the second row.

2. A system according to claim 1, wherein the comparison comprises an algorithm comparing functioning and nonfunctioning ones of the plurality of dies in the first row with a number of functioning and nonfunctioning ones of plurality of dies in the second row, and determining a percentage difference therefrom.

3. A system according to claim 2, wherein the testing device is further configured to signal a problem with a manufacturing process of the semiconductor wafer when the percentage difference exceeds a predetermined threshold value.

4. A system according to claim 2, further comprising a plurality of the first and second rows, wherein each of the first rows are adjacent to corresponding ones of the plurality of second rows.

5. A system according to claim 4, wherein the testing device comprises first and second computing portions corresponding to the first and second probing areas of the at least two probing areas.

6. A system according to claim 5, further comprising first and second control terminals coupled to the corresponding first and second computing portions.

7. A system according to claim 6, wherein the first and second control terminals are operable to input the algorithm.

8. A system according to claim 1, wherein each of the plurality of probing areas comprises at least one conductive contact configured to electrically contact at least one electrical contact pad associated with each of the plurality of dies.

9. A system according to claim 8, wherein the at least one conductive contact comprises at least one probe needle extending from each of the at least two probing areas.

10. A system according to claim 1, further comprising a database coupled to the testing device and configured to store the test data associated with the plurality of dies.

11. A system according to claim 1, wherein the probe device is a semiconductor wafer probe card.

12. A method of testing the functionality of a plurality of integrated circuit dies formed in a plurality of rows on a semiconductor wafer, the method comprising:
   testing the functionality of each of a plurality of dies in a first row of the plurality of rows with a first probing area;
   testing the functionality of each of a plurality of dies in a second row of the plurality of rows with a second probing area simultaneously with the testing of dies in the first row; and
   comparing test data regarding the testing of dies in the first row with test data regarding testing of dies in the second row.

13. A method according to claim 12, wherein the comparing comprises comparing using an algorithm employable to compare a number of functioning and nonfunctioning ones of the plurality of dies in the first row with a number of functioning and nonfunctioning ones of plurality of dies in the second row, and determining a percentage difference therefrom.

14. A method according to claim 13, further comprising signaling a problem with a manufacturing process of the semiconductor wafer when the determining determines a percentage difference that exceeds a predetermined threshold value.

15. A method according to claim 13, further comprising testing the functionality of each of a plurality of dies in a plurality of first rows simultaneously with testing the functionality of corresponding ones of a plurality of dies in a plurality of second rows wherein each of the first rows are adjacent to corresponding ones of the plurality of second rows.

16. A method according to claim 15, further comprising comparing using first and second computing portions corresponding to the first and second probing areas.

17. A method according to claim 16, further comprising controlling the comparing using first and second control terminals coupled to the corresponding first and second computing portions.

18. A method according to claim 17, further comprising inputting the algorithm for the comparing using the first and second control terminals.

19. A method according to claim 12, further comprising testing the functionality of each of the plurality of dies in the first and second rows using at least one conductive contact associated with each of the first and second probing areas and configured to electrically contact at least one electrical contact pad associated with each of the plurality of dies.

20. A method according to claim 19, wherein the at least one conductive contact comprises at least one probe needle extending from each of the at least two probing areas.

21. A method according to claim 12, further comprising storing the test data associated with the plurality of dies in a database.

22. A method according to claim 12, wherein the first and second probe areas are located on a semiconductor wafer probe card.

* * * * *